United States Patent [19]

De Andrea

[11] Patent Number: 4,602,829

[45] Date of Patent: Jul. 29, 1986

[54] RACK HOUSING FOR USER RECONFIGURABLE EDP SYSTEM

[75] Inventor: Renato De Andrea, Milan, Italy

[73] Assignee: Honeywell Information Systems Italia, Milan, Italy

[21] Appl. No.: 714,740

[22] Filed: Mar. 22, 1985

[30] Foreign Application Priority Data

Mar. 28, 1984 [IT] Italy .............................. 20258 A/84

[51] Int. Cl.$^4$ ............................................. H05K 5/02
[52] U.S. Cl. .................................... 312/320; 211/41; 361/415
[58] Field of Search ................. 312/320, 7.1; 361/415; 211/41

[56] References Cited

U.S. PATENT DOCUMENTS 3,904,937  9/1975  Levin ................................. 361/415
4,328,898  5/1982  Grassi ................................ 211/41
4,334,261  6/1982  Gonzales ......................... 361/415

Primary Examiner—William E. Lyddane
Assistant Examiner—Joseph Falk
Attorney, Agent, or Firm—Nicholas Prasinos; John S. Solakian

[57] ABSTRACT

Rack housing for user reconfigurable EDP system comprised of a frame frontally opened to allow the insertion of a plurality of printed wired artworks (PWA) each one in a rack position. A protection ruler fixed, with the aid of tools, to the open frame front prevents the extraction from the frame of the PWA constituting a basic EDP configuration. Substitution of optional PWAs into the system via selected rack positions is accomplished by suitable undercuttings selectively arranged on the projecting edge, and by one or more panels covering the open front and removably fixed. Each panel is easily removable without need of any tool, so that the protection ruler is positioned between frame and cover panel (or panels) and cannot be removed without the previous removal of the cover panel (or panels).

2 Claims, 1 Drawing Figure

RACK HOUSING FOR USER RECONFIGURABLE EDP SYSTEM

BACKGROUND OF THE INVENTION

1. Field of the Invention

The present invention relates to rack housing for user reconfigurable EDP systems.

2. Description of the Prior Art

Modern data processing systems are comprised of electronic circuits mounted on a plurality of printed circuit boards (PWA) housed in a box shaped frame having an open front and arranged therein on suitable parallel tracks. The tracks comprise racks for the mechanical positioning of the several PWAs. The PWAs, singly or in sets, carry out various functions such as the system central unit or of peripheral unit controllers. The frame front is open to allow the insertion of the several PWAs on the tracks and may be closed by a cover fixed by screws or by other fixing means such as the so-called "fasteners". Modern data processing systems are reconfigurable, to permit increased performance and meet the specific needs of the user by the addition of electronic circuits. This may be done by the addition of PWAs in the frame. Accordingly the frame is intended to contain a predetermined number of PWAs while the number actually inserted may vary from a minimum $M < N$ up to N according to the specific needs of the user. The minimum number M of PWAs comprises the minimum system configuration, that is, a set of electronic circuits which may be tested and which is able to operate in a correct way according to minimum user requirements.

In conventional manufacturing and distribution of such equipment the warehouse administration is affected by important cost problems. There are two approaches which may be followed.

According to a first approach the EDP systems are assembled with minimum configuration tested and packed, in order to be ready for distribution, then stored. The system reconfiguration, according to the user needs, is performed at the user site by specialized technical people which adds PWAs to the system. The cost of the specialized operation is high and does not conform to the technological trends of supplying products of the "plug and play" type which do not require specialized technical support for their installation.

According to a second approach the EDP systems are assembled in any possible configuration, tested, packed and stored. In this case a configured model suitable for any user need is available, but this causes an increase of the fixed store inventory. Moreover, in case the user-needs evolve, the already installed system must be substituted or a specialized operation is again required. To overcome such problems an embodiment has been recently suggested of a system where the reconfiguration can be performed by the user himself, if he is provided with a system having a minimum configuration and additional PWAs. The reconfiguration operation must be easy, must not require special devices and complicated assembly which may increase the cost of the product.

It is known in the art, for example from U.S. Pat. Nos. 4,334,261 and 4,301,494, that the open front of a rack housing for several PWAs can be closed by a plurality of cover plates, one for each PWA, fixed by knurled grips or fasteners. This solution permits possible system reconfiguration to be made by the users, but the equipment assembly becomes longer and more complicated, therefore causing a cost increase when compared with the cost of similar equipment provided with a single cover for the whole rack housing.

In both these cases the user is not prevented from removing the PWAs already installed. Further the repetitive modularity of the cover plates described in the above-mentioned patents can mislead the user in the reconfigurating operation.

OBJECTIVES OF THE INVENTION

A primary object of the invention is to provide a rack housing for user reconfigurable EDP systems.

SUMMARY OF THE INVENTION

The object of the invention is achieved by utilizing a rack housing for user reconfiguration. According to the invention the open housing front is closed by a single cover, easily removed by the user; or in the alternative the open front is closed by a plurality of covers each of them, however, covering a plurality of PWAs and providing selective access to predetermined housing rails, and whereby removal of the PWAs arranged on the remaining rails is prevented by a protection and stopping ruler. The protection ruler is provided with suitable undercuttings which correspond to the housing positions where the selective introduction of PWAs is allowed. It is interposed between the frame and the cover so that its removal requires the cover removal. It is attached to the frame by means of screws different from the ones attaching the cover so that the cover removal does not involve the ruler removal. Moreover the screws attaching the ruler to the frame are of a kind requiring the use of a special tool, and they are preferably masked by the cover. In this way double protection is assured because any accidental removal of the ruler without the previous cover removal is prevented.

BRIEF DESCRIPTION OF THE DRAWINGS

These and other features of the invention will appear clearly from the following description of a preferred embodiment and from the enclosed drawing where.

DESCRIPTION OF A PREFERRED EMBODIMENT

Figure 1:
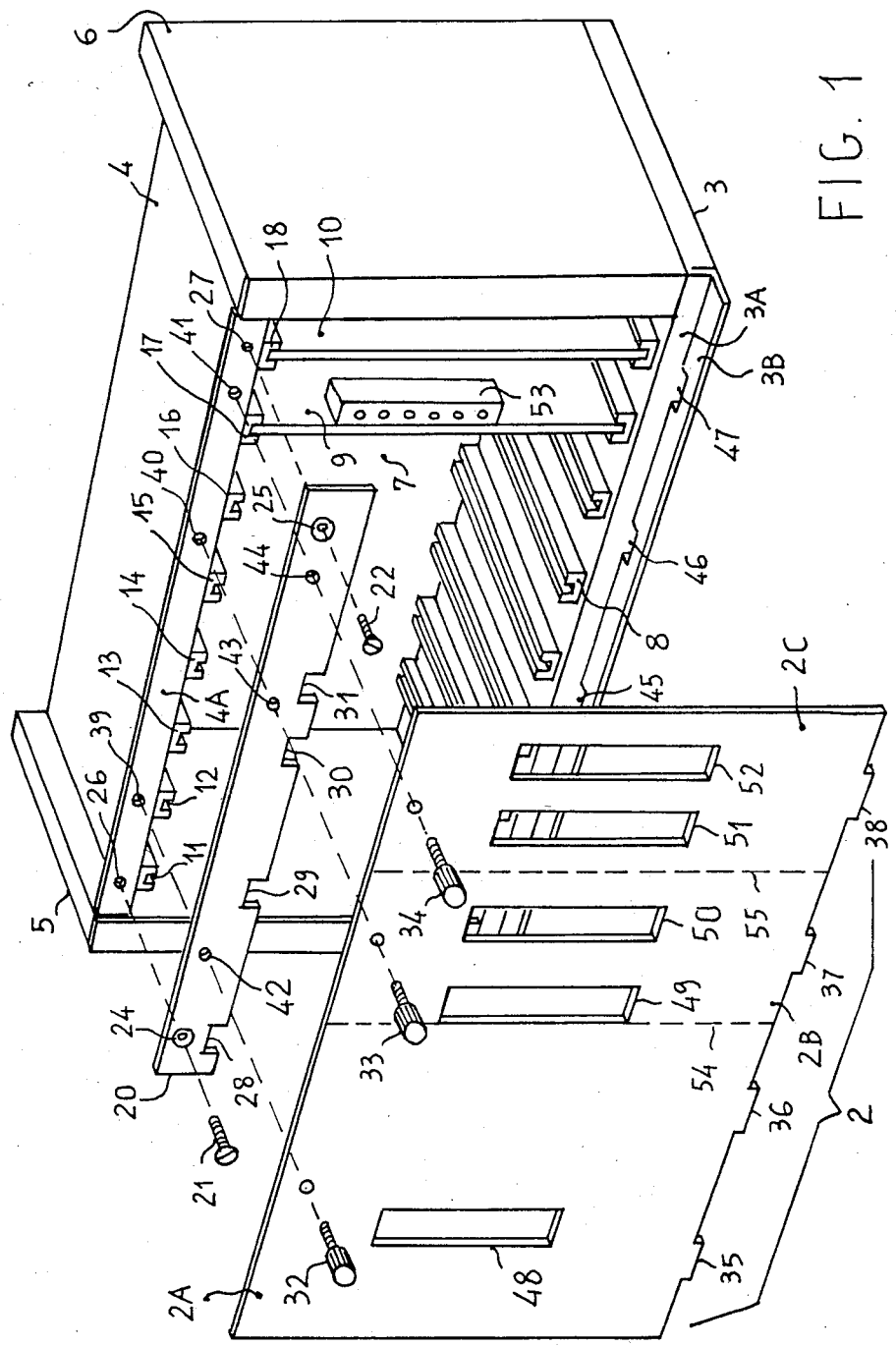
FIG. 1 shows in exploded perspective view a preferred embodiment of the invention.

Referring to FIG. 1 the invention comprises a box having a rigid frame and a front panel 2 which can be removed. The frame is comprised by a lower panel 3, an upper panel 4, two side panels 5, 6 and a back panel 7. Some edges of the several panels present an L-shaped bend for providing more stiffness to the unit. The panels are attached to each other to form a unitary body, preferably by welding. The several panels comprise a rectangular parallelepiped shaped housing, frontally opened, with their fore edges defining a frontal plane. For purposes of the invention, it is specifically pointed out that lower panel 3 is double L bent and aligned with the front panel in order to present a laying flange 3A on the front plane, and a horizontal foot 3B which extends perpendicularly from the front plane for the whole width of the frame. In a similar manner, upper panel 4 presents an L shaped bend which extends outwardly in order to obtain a laying flange 4A on the front plane. Inside the housing the lower and upper panels bear a plurality of PWA tracks arranged parallel to each other and perpendicular to the open front plane of the housing. For clarity only, one of such tracks is shown having reference number 8. Each track arranged on the lower panel corresponds to a track arranged on the upper panel in the same perpendicular plane. Each of such tracks is provided with a guiding groove intended to contain a PWA edge. In FIG. 1 the housing is, for example, embodied with 8 lower tracks and 8 upper tracks; that is, with 8 PWA locations, and it can therefore contain up to 8 PWAs. The several locations are identified in FIG. 1 by means of the upper tracks and are numbered from 11 to 18.

The PWAs are inserted into the housing through the front insertion of the upper and lower edges of the PWAs into the groove of an upper tracks and a corresponding lower track respectively. In FIG. 1, 2 PWAs 9, 10 are shown inserted in the housing. The back panel 7 is generally provided with connecting sockets, not shown, vetically arranged and intended to complete the electrical connection when the PWAs are inserted in the housing. The several PWAs comprise a reconfigurable EDP system wherein the PWAs arranged, for example, into locations 12, 14, 17, 18 must be present to comprise the basic system, while locations 11, 13, 15, 16 may or may not contain PWAs and can be used to extend the system performance. For instance, a PWA acting as a central unit or CPU can be inserted into location 12, a PWA acting as a working memory or MM can be inserted into locaton 14, two PWAs acting as controllers for peripheral units, such as disk units, can be inserted into locations 17, 18. Some memory expansion PWAs can be optionally inserted into locations 11, 13 and PWAs acting as controllers of peripherals such as printers, connection terminals and transmission lines, etc., can be optionally inserted into locations 15, 16. The system's basic PWAs are inserted into the housing during the manufacturing process and are retained in the housing by a protection and stopping ruler 20. Ruler 20 extends for the whole width of the rack housing and is fixed by screws 21, 22 to the flange 4A of upper panel 4. Screws 21, 22 are inserted into opening 24, 25 of the ruler and screw in corresponding threaded housings 26, 27 of flange 4A. Screws 21, 22 are preferably tapered-head screws and the openings 24, 25 are similarly tapered in order to house the heads of screws 21, 22 within ruler 20 thickness. When ruler 20 is positioned, it partially closes the front opening of the housing of the upper tracks by the extension of its lower edge downwards, beyond flange 4A. In this way it prevents the extraction or the removal of the basic PWAs from the respective locations. Ruler 20 presents some notches or undercuttings 28, 29, 30, 31 in alignment with locations 11, 13, 16, 17 respectively; that is in alignment to the reconfiguration and expansion PWA locations. Such undercuttings permit PWA insertion or removal from the corresponding locations 11, 13, 16, 17 even if ruler 20 is fixed to the frame. The frame opening is closed by a front panel 2 extending for the whole width and height of the frame and overlapping ruler 20. Front panel 2 is fixed to the frame by means of knobs screws 32, 33, 34 and by cogs 35, 36, 37, 38. The screws are inserted into corresponding openings of the front panel and screw in correspondingly threaded frame housings 39, 40, 41 by first passing through suitable openings 42, 43, 44 of ruler 20. Cogs 35, 36, 37, 38, arranged on the lower edge of panel 2, engage the corresponding housings 45, 46, 47 located on the flange 3B. When the front panel is fixed to the frame, it protects the PWAs arranged in the housing and prevents their removal irrespective of their location. Front panel 2 has suitable openings such as 48, 49, 50, 51, 52 to allow the insertion of connecting plugs into connection sockets mounted on the front edge of the PWA. One such socket is shown in FIG. 1, having reference numeral 53. Such connectors enable the connection, by cable, to peripheral units of the system. For example, through opening 48 the connection of a control keyboard and of a display screen to the central unit PWA may be made; through openings 49, 50 connection can be made with optional peripherals to optional PWAs which may be arranged in locations 15, 16; through openings 51, 52 connection of basic peripherals of the system to the control PWAs can be made via locations 17, 18.

With the above disclosed rack housing the expansion or reconfiguration operation performed by the user is simple and safe. The user can remove front panel 2 by unscrewing the screws 32, 33, 34 without using any tools. He can therefore insert additional PWAs (or substitute them) into the selected locations and only in those locations whose access is allowed by ruler 20. Thus the basic PWA arrangement need not be disturbed. Ruler undercuttings 28, 29, 30, 31 clearly display the several insertion positions and reduce to a minimum the possible occurrence of mistakes. It is clear that the front panel removal may require the extraction of possible connecting plugs from their sockets, and these plugs must be inserted again at the end of the reconfigurating operation. To minimize such operations, which may involve possible mistakes the front panel can be cut in two or more independent sections, each panel section assuring the protection and the retaining of a suitable group to PWAs. For instance, panel 2 of FIG. 1, can be cut into three sections 2A, 2B, 2C evidenced by hatched lines 54, 55. So panel 2A assures the retaining and the protection of the group of PWAs arranged into locations 11, 12, 13, 14. Panel 2B assures the retaining and the protection of the group of PWAs arranged into locations 15, 16 and panel 2C assures the retaining and the protection of the group of PWAs arranged into locations 17, 18. Therefore the insertion and the substitution of PWAs into locations 11, 13 only require the removal of panel 2A and the extension of one connector. In a similar manner the insertion and the substitution of PWAs into locations 15, 16 only requires the removal of panel 2B and of one connector. It is to be noted that the use of a knob screw is not essential for the fixing of panel 2C, since such panel protects some basic PWAs of the system. It is also to be noted that panel 2C and more generally a plurality of panels protecting some basic PWAs of the system may comprise, together with rule 20, a single unit. The fixing means for ruler 20 and for the panels preferably suggested as tapered-head screws and knob screws respectively can clearly be substituted by equivalent fixing means. So, the knob screws preferred for the fixing of the panels can be substituted with slotted head screws which can be unscrewed and screwed by screwdrivers, coins or similar means. In this case the fixing screws of the ruler could be of a specialized kind, which can be unscrewed and screwed only by means of wrenches, cross-head screwdriver, square-head, hexagonal-head, star-head-keys, etc.

What is claimed is:

1. Rack housing for user reconfigurable EDP system comprising:

a frame having an open front to allow the insertion of a plurality of printed wired artworks (PWA) each one in a rack location defined in said frame by a pair of tracks in which PWA edges may be inserted from said open front;

a protection ruler removably fixed with the aid of first type tools to the open frame front and having an edge projecting on said open frame front, in order to prevent the extraction from tracks of the PWA constituting a basic system configuration, said projecting edge being provided with undercutting selectively arranged along said edge, to enable the manual extraction/insertion of PWAs in tracks of selected rack locations when said protection ruler is fixed to the open frame front; and a panel at least, covering the open front and removably fixed, without tools or with tools of a second type, to the frame front, in a way such that the protection ruler is positioned between frame and panel and cannot be removed without the previous removal of said panel, said panel, when fixed to said open frame front preventing the extraction of PWAs from said tracks of selected rack locations and the removal of said protection ruler.

2. Rack housing as per claim 1 wherein said protection ruler is fixed to the open frame front by tapered head screws and said panel is fixed to the open frame front by knob screws getting through openings in said protection ruler.

* * * * *